United States Patent [19]
Tsai et al.

[11] Patent Number: 5,664,624
[45] Date of Patent: Sep. 9, 1997

[54] SLOPED WALL TYPE HEAT RADIATING MEMBER FOR CHIP

[75] Inventors: Chin-Fu Tsai, 4th Floor, No. 9-2, Lane 264, Sec. 2, An-Kang Road, Hsin-Tien City, Taipei Hsien, Taiwan; Kuo-Kun Chen, Taipei, Taiwan

[73] Assignee: Chin-Fu Tsai, Taipei Hsien, Taiwan

[21] Appl. No.: 743,347

[22] Filed: Nov. 4, 1996

[51] Int. Cl.$^6$ .................................................. H05K 7/20
[52] U.S. Cl. ..................... 165/80.3; 165/121; 165/185; 361/697; 257/719
[58] Field of Search .......................... 165/80.3, 185, 165/121; 361/697; 257/719

[56] References Cited

U.S. PATENT DOCUMENTS

| | | | |
|---|---|---|---|
| 4,712,159 | 12/1987 | Clemens | 165/80.3 X |
| 4,972,294 | 11/1990 | Moses, Jr. et al. | 165/80.3 X |
| 5,343,362 | 8/1994 | Solberg | 361/710 |
| 5,436,798 | 7/1995 | Wieland, Jr. | 361/710 |
| 5,495,392 | 2/1996 | Shen | 361/697 |
| 5,521,439 | 5/1996 | Casati et al. | 257/718 |
| 5,590,025 | 12/1996 | Clemens | 361/695 |

OTHER PUBLICATIONS

"Burn–In Cooling Hat for TCMS" From Research Disclosure No. 306 Kenneth Mason Pubs. Oct. 1989.

*Primary Examiner*—Allen J. Flanigan
*Attorney, Agent, or Firm*—Morton J. Rosenberg; David L Klein

[57] ABSTRACT

A sloped wall type heat radiating member for chip, which is tightly attached to the upper side of the chip on a chip base for increasing the heat radiating efficiency of the chip. Two sloped walls inclinedly upwardly project respectively from two opposite sides of the heat radiating member toward each other, whereby a heat radiating fan is firmly inserted between the slope walls without using any fastening element such as screws. Two resilient slidable latching boards are disposed respectively on two sides of the heat radiating member. The bottom end of each latching board is formed with at least one latching hole for latching a lug disposed on each side of the chip base. The latching board is further formed with a guide section, whereby when the latching board is depressed by a user, the guide section is inclinedly moved downwardly along the sloped wall of the heat radiating member, making the latching hole of the latching board automatically unlatch the lug of the chip base.

5 Claims, 3 Drawing Sheets

SLOPED WALL TYPE HEAT RADIATING MEMBER FOR CHIP

BACKGROUND OF THE INVENTION

The present invention relates to a sloped wall type heat radiating member for a chip, in which two sloped walls inclinedly upwardly project respectively from two opposite sides of the heat radiating member toward each other, whereby a heat radiating fan is firmly inserted between the slope walls. Two resilient slidable latching boards are disposed respectively on two sides of the heat radiating member. Each latching board is formed with a guide section, whereby when the latching board is depressed by a user, the slope walls of the heat radiating member serve to guide and slightly outwardly bias the latching boards, making the latching holes of the latching boards automatically unlatch the lugs of the chip base so that the heat radiating member can be easily and smoothly disassembled from the chip base.

A chip such as CPU used in a computer serves to quickly process great amount of data. After a period of operation, the temperature of the chip will ascend. This will affect the execution function and speed of the chip. Further, an excessively high temperature will lead to damage of the chip. Therefore, various kinds of heat radiating members have been developed to tightly attach to the chip and a heat radiating fan is additionally mounted on the heat radiating member for increasing the heat radiating efficiency of the chip. FIG. 1 shows a conventional heat radiating member 5 for chip, which is made of good heat conductive material. Multiple heat radiating fin plates 52 upward project from the top face of a base board section 51. A heat radiating fan 50 is installed on the heat radiating member 5 by screws 54 passing through the through holes of the fan to be fastened between adjacent fin plates 52 of the heat radiating member 5. Accordingly, the fan 50 must be assembled with the heat radiating member 5 by means of screws 54 and screwdriver. It is troublesome and inconvenient to perform such an assembling procedure.

In addition, two adjustment bolts 55 are disposed on two sides of the conventional heat radiating member 5. A latching board 56 is associated with each adjustment bolt 55, whereby the latching board 56 can be lifted or lowered by means of adjusting the adjustment bolts 55, making the latching holes 561 at bottom ends of the latching boards 56 latch two lugs 571 of a chip base 57. Therefore, the heat radiating member 5 can be firmly mounted on the chip base 57. However, it is laborious and time-consuming to operate the latching boards 56 by means of screwing the adjustment bolts 55. Moreover, the latching boards 56 are apt to loosen from the lugs 571 after long periods of vibration.

SUMMARY OF THE INVENTION

It is therefore a primary object of the present invention to provide a sloped wall type heat radiating member for chip having two sloped walls inclinedly upwardly projecting respectively from two opposite sides of the heat radiating member toward each other, whereby:

1. The heat radiating fan can be directly inserted between the sloped walls of the heat radiating member, which are able to firmly clamp the fan. Therefore, the heat radiating fan can be easily and quickly assembled with the heat radiating member without using any fastening element or tool such as screw, screwdriver, etc.
2. When a user depresses latching boards of the heat radiating member, the slope walls thereof serve to guide and slightly outwardly bias the latching boards, making the latching holes of the latching boards automatically unlatch the lugs of the chip base so that the heat radiating member can be easily and smoothly disassembled from the chip base.

The present invention can be best understood through the following description and accompanying drawing, wherein:

DETAILED DESCRIPTION OF THE PREFERRED EMBODIMENT

Figure 1:
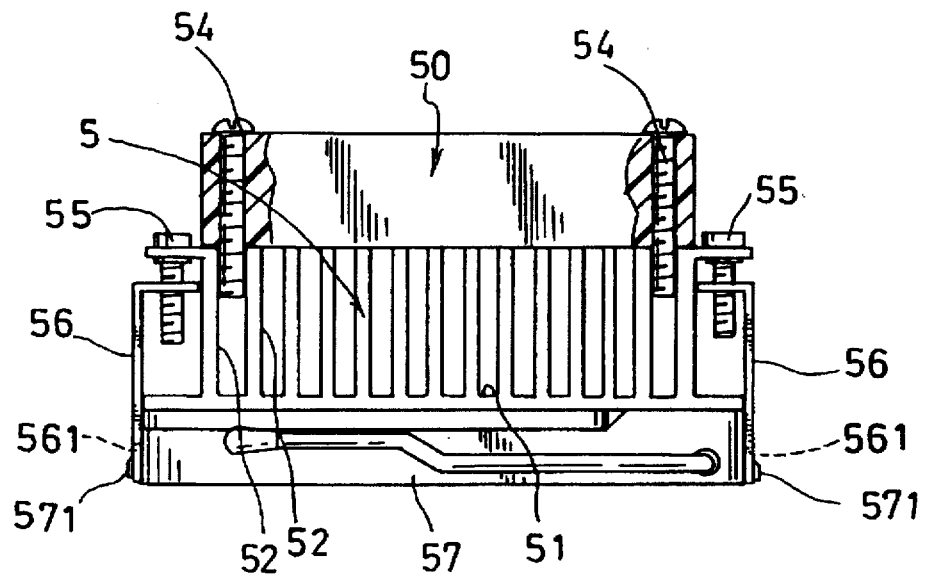
FIG. 1 shows a conventional heat radiating member and heat radiating fan for a chip, which are assembled with a chip base.
Figure 2:
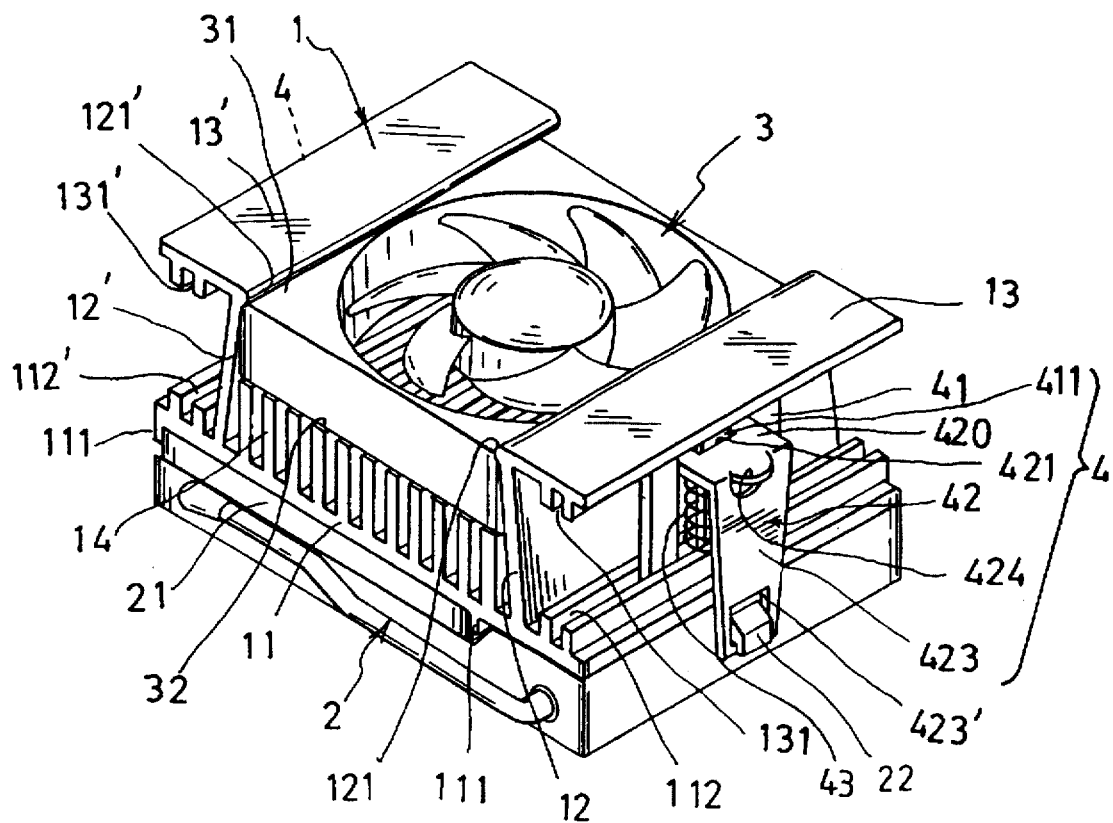
FIG. 2 is a perspective assembled view of the present invention associated with a heat radiating fan and a chip base.
Figure 3:
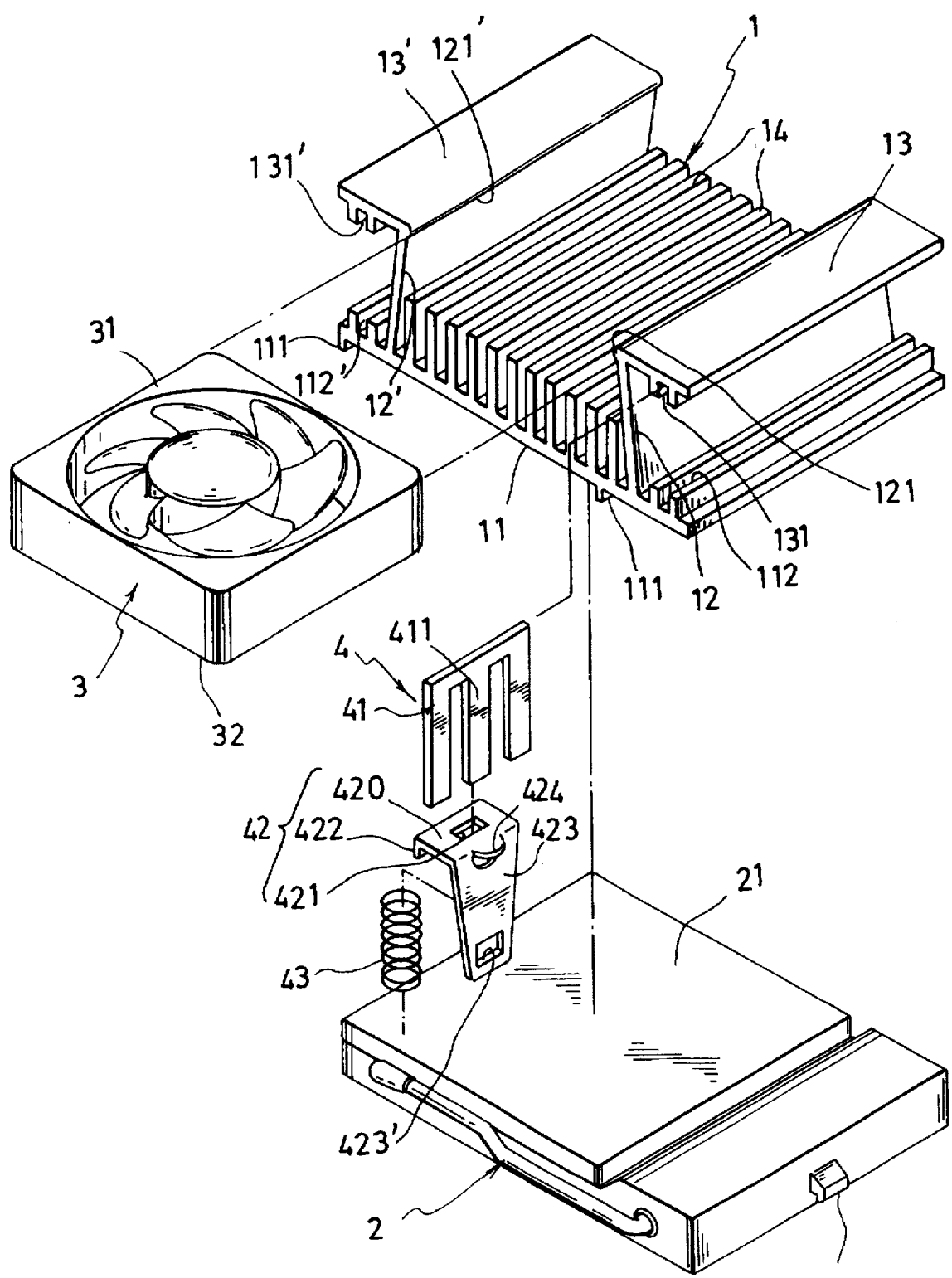
FIG. 3 is a perspective exploded view of the present invention according to FIG. 2.
Figure 4:
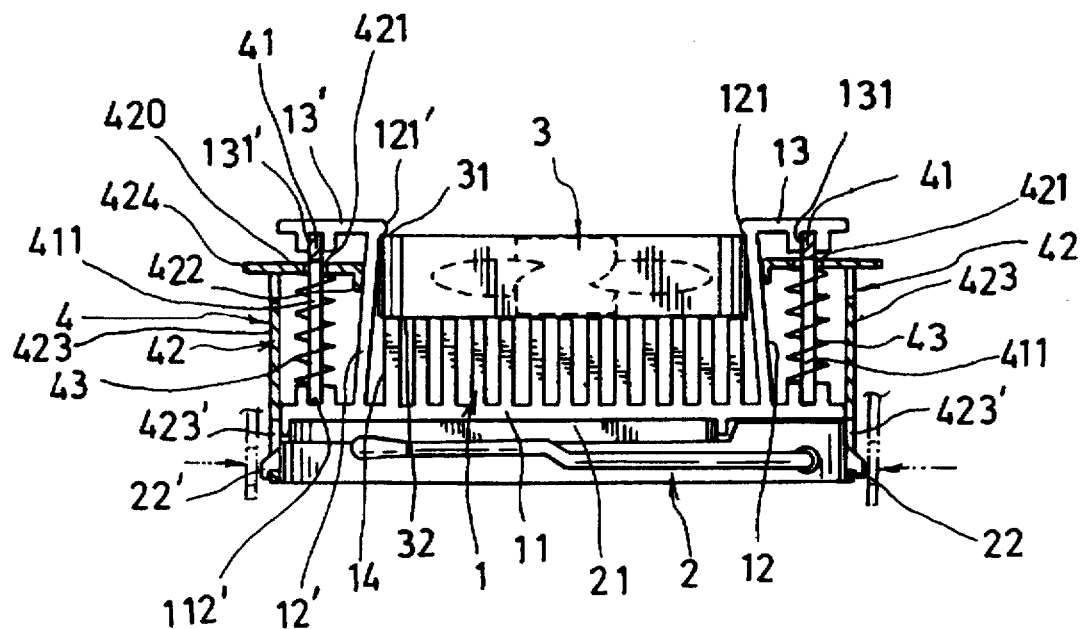
FIG. 4 is a partially sectional assembled view of the present invention associated with the heat radiating fan and the chip base.

Please refer to FIGS. 2 to 4. The heat radiating member 1 of the present invention is made of a heat conductive material for tightly attaching to upper side of a chip 21 of a chip base 2. A heat radiating fan 3 can be inserted in the heat radiating member 1 for increasing the heat radiation efficiency of the chip 21 so as to keep the chip 21 in normal operation.

The heat radiating member 1 includes a base board section 11 having two projections 111 downwardly extending from the bottom side of the base board section 11. The distance between the two projections 111 is equal to the distance between two lateral sides of the chip 21, whereby the heat radiating member 1 can ride over the chip 21 with the two projections 111 respectively abutting against two lateral sides of the chip 21. Two slope walls 12, 12' inclinedly upwardly project from two sides of top face of the base board section 11 respectively. The distance between the slope walls 12, 12' is upward tapered. A transverse board section 13, 13' transversely outwardly extends from top end of each slope wall 12, 12'. At least one slide channel 131, 131' is formed under bottom face of each transverse board section 13, 13' corresponding to a guide channel 112, 112' of each lateral side of the base board section 11.

Multiple heat radiating fin plates 14 upwardly project from the top face of the base board section 11 for increasing the heat radiating efficiency of the heat radiating member 1. The distance between the top ends of the slope walls 12, 12' of the heat radiating member 1 is less than or equal to the width of the heat radiating fan 3, whereby when the heat radiating fan 3 is inserted between the slope walls 12, 12' the slope walls 12, 12' are resiliently biased outwardly to enlarge the distance therebetween so as to tightly clamp the heat radiating fan 3.

The inner edges of the slope walls 12, 12' can be further respectively formed with two inward projecting flanges 121, 121' opposite to each other, whereby when the heat radiating fan 3 is inserted between the slope walls 12, 12'. The flanges 121, 121' abut against the top end 31 of the fan 3 with the bottom face 32 of the fan 3 abutting against the top ends of the heat radiating fin plates 14 so as to more firmly secure the fan 3 in the heat radiating member 1 without detachment due to long periods of vibration.

Two latching hook means 4 are respectively disposed on two lateral sides of the heat radiating member 1. Each latching hook means 4 includes a guide board 41 slidably fitted in the slide channel 131, 131' of the transverse board section 13, 13' in alignment with the guide channel 112, 112' of the base board section 11. Each guide board 41 at least has a downwardly extending guide arm 411. The latching hook means 4 also includes a latching board 42 having a top face board 420 formed with a through hole 421 for the guide arm 411 to pass therethrough and a guide section 422 abutting against the outer face of the slope wall 12, 12'. The other side of the top face board 420 has a downwardly extending latching arm 423 formed with a latching hole 423' at bottom end. A spring 43 is fitted around the guide arm 411 and compressed between the latching board 42 and the heat radiating member 1 for upwardly pushing and restoring the latching board in normal state. Accordingly, a user can depress the latching boards 42 of the latching hook means 4, making two lugs 22, 22' disposed on two sides of the chip base 2 latched in the latching holes 423'. Then the latching boards 42 are released and the springs 43 upwardly push the latching boards 42 to be firmly hooked by the lugs 22, 22' of the chip base 2, whereby the heat radiating member 1 is securely tightly attached to the top face of the chip 21 as shown in FIG. 4.

Figure 5:
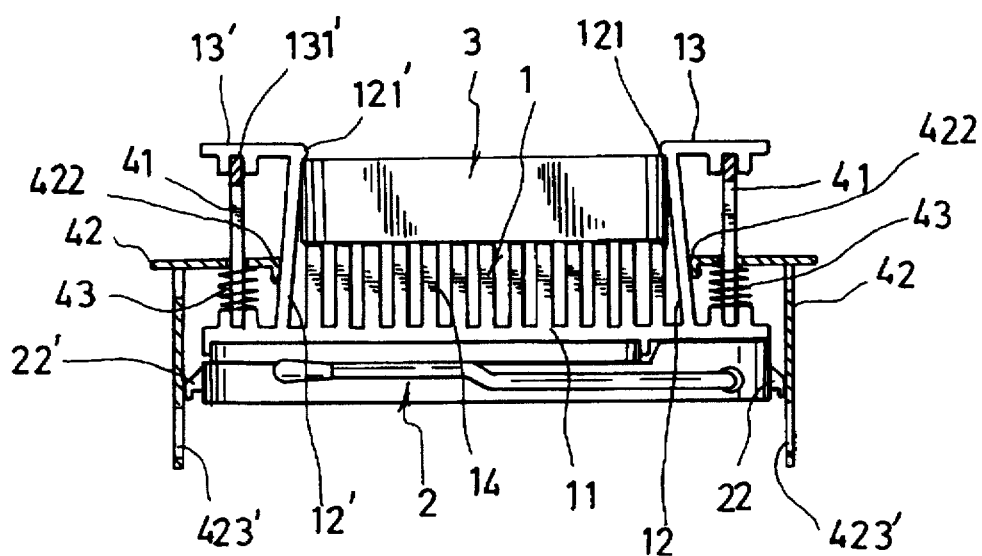
FIG. 5 is a partially sectional view according to FIG. 4, showing that the latching boards are depressed to unlatch the chip base.

Referring to FIG. 5, when detaching the heat radiating member 1 from the chip base 2, the latching boards 42 are directly resiliently depressed to make the guide sections 422 of the top face boards thereof move downward along the inclination of the slope walls 12, 12', whereby the latching holes 423' of the latching boards 42 are simultaneously displaced from the lugs 22, 22' of the chip base 2 so as to unlatch the same. (The user no more needs to slightly bias the latching boards outward as in the conventional device.) Therefore, the heat radiating member 1 can be easily detached from the chip base 2 without damaging the lugs 22, 22' thereof.

The through hole 421 of the latching board 42 is slightly larger than the guide arm 411, so that when passed through the through hole 421 of the latching board 42, a clearance is defined between the guide arm 411 and the periphery of the through hole 421. Accordingly, when the latching board 42 is depressed to slide downwardly, the guide section 422 can be downwardly moved along the outer face of the slope wall 12, 12' with the latching hole 423' of the latching arm 423 simultaneously displaced and separated from the lugs 22, 22' of the chip base 2. Naturally, when it is desired to assemble the heat radiating member 1 with the chip base 2 (as shown by solid lines of FIG. 4), the user can depress the latching boards 42 and slightly inwardly bias the latching arms 423 at the same time (as shown by phantom lines of FIG. 4), whereby when the latching boards 42 are released and restored upwardly, the lugs 22, 22' of the chip base 2 are latched in the latching holes 423'.

The advantages of the present invention are as follows:

1. The heat radiating fan can be directly inserted between the sloped walls without using any fastening element or tool such as screw, screwdriver, etc. Therefore, the heat radiating fan can be easily and quickly assembled with the heat radiating member.

2. The latching holes of the latching boards are guided to automatically unlatch the lugs of the chip base so that the heat radiating member can be easily and smoothly disassembled from the chip base.

It is to be understood that the above description and drawings are only used for illustrating one embodiment of the present invention, not intended to limit the scope thereof. Many modifications dan be made without departing from the spirit of the present invention. For example, the latching arm 423 can be formed with an outward projecting depression section 424 for the user to depress the latching board 42.

What is claimed is:

1. A sloped wall type heat radiating member for a chip, which is tightly attached to upper side of the chip on a chip base, said heat radiating member comprising:

two sloped walls inclinedly and upwardly projecting from two opposite sides of a base board section of the heat radiating member respectively; and two latching hook means respectively disposed on outer sides of the sloped walls, each latching hook means including a resilient slidable latching board formed with at least one through hole and a guide section abutting against an outer face of the adjacent sloped wall, whereby a heat radiating fan is inserted between the sloped walls such that when depressing the latching boards, the latching boards are moved downward along the sloped walls, making latching holes of the latching boards automatically unlatch lugs of the chip base.

2. A heat radiating member as claimed in claim 1, wherein the base board section is disposed with at least two projections downwardly extending from bottom face of the base board section, the distance between the two projections being equal to the distance between two opposite sides of the chip.

3. A heat radiating member as claimed in claim 1, wherein multiple heat radiating fin plates upwardly project from a top face of the base board section and inner edges of the sloped walls are respectively formed with two inwardly projecting flanges opposite to each other.

4. A heat radiating member as claimed in claim 1, wherein a transverse board section transversely outwardly extends from top end of each sloped wall and at least one slide channel is formed under a bottom face of each transverse board section, a guide channel being formed on each lateral side of the base board section corresponding to the slide channel of the transverse board section, whereby the latching hook means is fitted in the guide channel and the slide channel.

5. A heat radiating member as claimed in claim 4, wherein each latching hook means includes:

a guide board slidably fitted in the slide channel of the transverse board section in alignment with the guide channel of the base board section, each guide board at least having a downwardly extending guide arm;

a latching board having a top face board formed with a through hole for the guide arm to pass therethrough and a guide section abutting against the outer face of the sloped wall, one side of the top face board having a downward extending latching arm formed with at least one latching hole;

a spring fitted around the guide arm and compressed between the latching board and the heat radiating member for upwardly pushing and restoring the latching board to a normal state.

* * * * *